US009627446B2

(12) United States Patent
Yang et al.

(10) Patent No.: US 9,627,446 B2
(45) Date of Patent: Apr. 18, 2017

(54) DISPLAY DEVICE

(71) Applicant: AU OPTRONICS CORP., Hsin-Chu (TW)

(72) Inventors: Hsueh-Yen Yang, Hsin-Chu (TW); Hong-Shen Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 119 days.

(21) Appl. No.: 14/585,999

(22) Filed: Dec. 30, 2014

(65) Prior Publication Data

US 2015/0319822 A1    Nov. 5, 2015

(30) Foreign Application Priority Data

May 5, 2014   (TW) .............. 103115994 A

(51) Int. Cl.
    *G02F 1/1335* (2006.01)
    *H01L 27/32* (2006.01)
    *H05B 33/14* (2006.01)

(52) U.S. Cl.
    CPC .......... *H01L 27/32* (2013.01); *H01L 27/3218* (2013.01); *H05B 33/145* (2013.01)

(58) Field of Classification Search
    CPC .... H05B 33/145; H01L 27/132; G02F 1/1335
    USPC ........................................................ 349/106
    See application file for complete search history.

(56) References Cited

U.S. PATENT DOCUMENTS 5,926,239 A * 7/1999 Kumar .............. G02F 1/133617
                                                    349/69
6,914,649 B2    7/2005 Liu
7,292,253 B2   11/2007 Asai et al.
7,755,652 B2    7/2010 Credelle et al.
8,350,940 B2    1/2013 Smith et al.
2002/0047958 A1 * 4/2002 Hirata ................ G02F 1/13392
                                                   349/106
2010/0149393 A1    6/2010 Zarnowski et al.

(Continued)

FOREIGN PATENT DOCUMENTS

| CN | 102830450 A | 12/2012 |
| CN | 103543548 A | 1/2014 |
| CN | 103745684 A | 4/2014 |

OTHER PUBLICATIONS

Taiwan Intellectual Property Office, "Office action", issued on Feb. 19, 2016.

*Primary Examiner* — Lucy Chien
(74) *Attorney, Agent, or Firm* — WPAT, PC; Justin King

(57) ABSTRACT

A display device includes a substrate and subpixel groups disposed on the substrate. Each subpixel group includes four first subpixels for emitting four first color lights, four second subpixels for emitting four second color lights, and eight third subpixels for emitting eight third color lights. The first subpixels, the second subpixels, and the third subpixels are respectively arranged adjacent to each other along a first axis and a second axis intersecting the first axis, in which each of the first subpixels is located adjacent to another one of the first subpixels along the first axis or the second axis, each of the second subpixels is located adjacent to another one of the second subpixels along the first axis or the second axis, and each of the third subpixels is located adjacent to another one of the third subpixels along at least one of the first axis and the second axis.

19 Claims, 7 Drawing Sheets

(56) References Cited

U.S. PATENT DOCUMENTS

2013/0106891 A1 5/2013 Matsueda et al.
2015/0130868 A1 5/2015 Feng

* cited by examiner

DISPLAY DEVICE

FIELD OF THE INVENTION

The present invention relates to a display device, and more particularly to an organic light-emitting diode (Organic Light-Emitting Diode; OLED) display device.

BACKGROUND

The OLED display, compared to other flat panel displays, has outstanding features of self-luminous, high brightness, wide viewing angle, high contrast, low power consumption, fast response, wide operating temperature range, high luminous efficiency, and process simplicity, drawing worldwide attention on the technological development of the OLED display.

In the application of the display, full color is becoming a necessary condition for the standard of display, and the quality of the system depends on the resolution of pixels and the arrangement of subpixels, and the resolution unit is dpi (dot per inch). Generally speaking, each of the pixels is made of red (R), green (G), and blue (B) which are subpixels of three primary colors, to produce different shade of color mixing effect. Subpixels arrangements on the present industrial application include stripe arrangements, mosaic arrangements and delta arrangements.

However, since the circuit design, manufacturing process and driving method of the OLED display are more complicated, the layout density of the subpixels will be restricted and cannot be improved if the above-mentioned arrangements are simply used to make panels, thereby affecting the overall resolution of the panels.

SUMMARY

The present invention provides a display device, in order to solve the problems of the prior art.

An embodiment of the present invention discloses a display device including a substrate and a plurality of subpixel groups disposed on the substrate. Each of the subpixel groups includes four first subpixels for emitting four first color lights, four second subpixels for emitting four second color lights, and eight third subpixels for emitting eight third color lights. The first subpixels, the second subpixels, and the third subpixels are respectively arranged adjacent to each other along a first axis and a second axis intersecting the first axis, in which each of the first subpixels is located adjacent to another one of the first subpixels along the first axis or the second axis, each of the second subpixels is located adjacent to another one of the second subpixels along the first axis or the second axis, and each of the third subpixels is located adjacent to another one of the third subpixels along at least one of the first axis and the second axis.

Accordingly, the resolution of the display device can be effectively increased, and a better image quality would be obtained.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
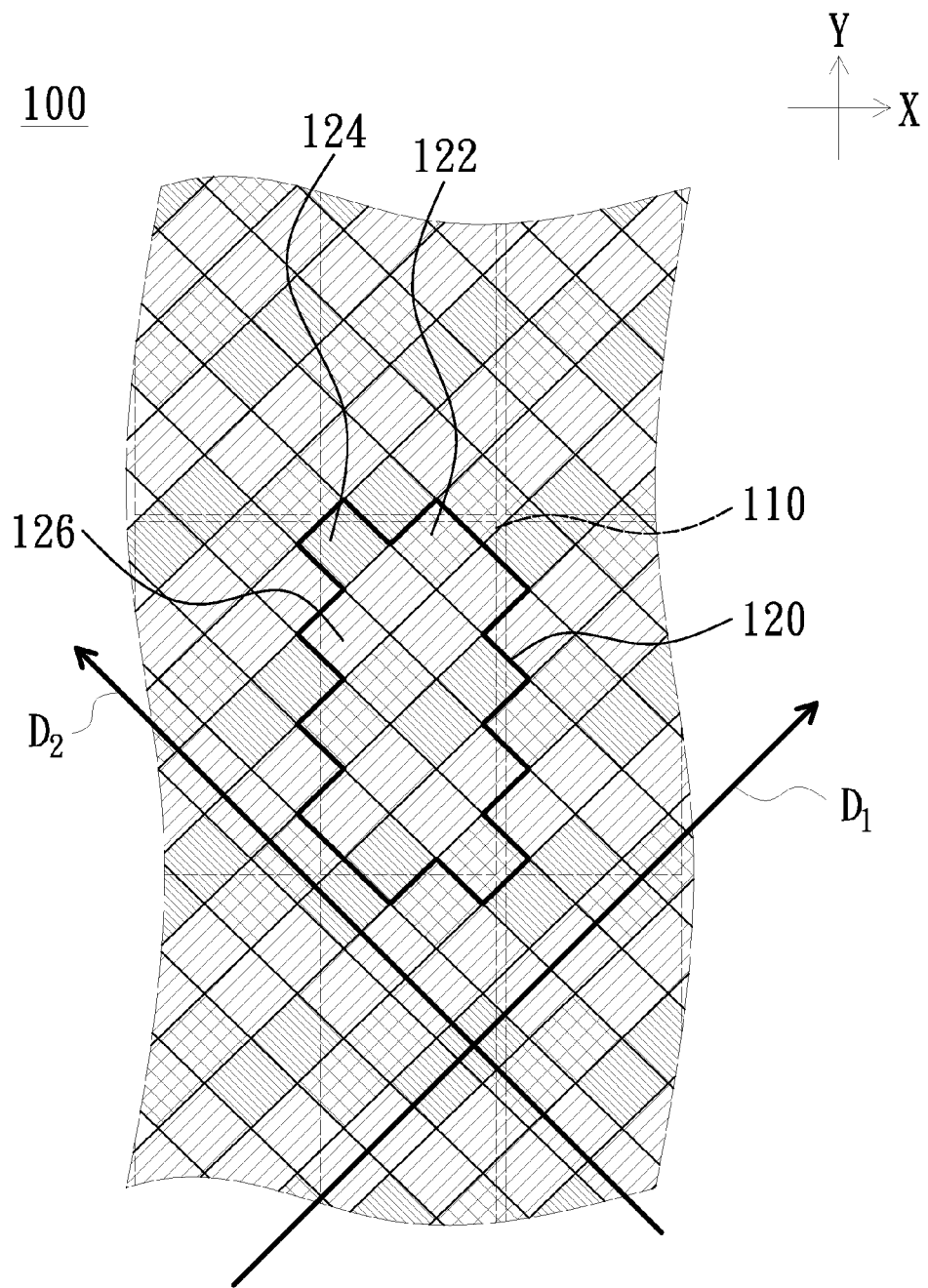
FIG. 1 is a schematic diagram for showing the arrangement of subpixel groups of the display device according to the first embodiment of the present invention.

The present invention will now be described more specifically with reference to the following embodiments. It is to be noted that the following descriptions of embodiments of this invention are presented herein for purpose of illustration and description only. It is not intended to be exhaustive or to be limited to the precise form disclosed.

Referring to FIG. 1 to FIG. 7, FIG. 1 to FIG. 7 respectively show the arrangement of subpixel groups 120 of the display devices 100/200/300/400/500/600/700 according to the first to seventh embodiments of the present invention. As shown in FIG. 1 to FIG. 7, the display devices 100/200/300/400/500/600/700 include a substrate 110 and a plurality of subpixel groups 120 disposed on the substrate 110. Each of the subpixel groups 120 includes four first subpixels 122 for emitting four first color lights, four second subpixels 124 for emitting four second color lights, and eight third subpixels 126/126a/126b/126c. With the first subpixels 122, the second subpixels 124 and the third subpixels 126/126a/126b/126c emit different color lights, and the display device 100/200/300/400/500/600/700 can get the desired color mixing effects. In the following embodiments of the present invention, the first color light is approximately about blue, and the second color light is approximately about red. That is, the first subpixels 122 are used for emitting blue lights and the second subpixels 124 are used for emitting red lights, but the present invention is not limited thereto. In other embodiments, we can adjust colors represented by the first subpixels 122, the second subpixels 124 and the third subpixels 126/126a/126b/126c to achieve a desired mixing color effect when a full color displays. In the embodiments of the present invention, the planar shapes of the first subpixels 122, the second subpixels 124 and the third subpixels 126/126a/126b/126c are generally about rectangular, but the present invention is not limited thereto.

Additionally, in some embodiments of the present invention, the display devices 100/200/300/400/500/600/700 may be active or passive matrix display devices according to the driving types, and can be used in top emission or bottom emission display devices according to two luminescent types, but the present invention is not limited thereto. Also, in some embodiments of the present invention, the substrate 110 may be a glass substrate, a quartz substrate, or a plastic substrate, but the present invention is not limited thereto.

Furthermore, the first subpixels 122, the second subpixels 124 and the third subpixels 126/126a/126b/126c in each of the subpixel groups 120 are respectively arranged adjacent to each other along a first axis $D_1$ and a second axis $D_2$ intersecting the first axis $D_1$. In some embodiments, the first axis $D_1$ and the second axis $D_2$ are intersected each other. Meanwhile, the first axis $D_1$ and the second axis $D_2$ can be perpendicular to each other, and are respectively parallel to the X axis and the Y axis. In other embodiments, the first axis $D_1$ and the second axis $D_2$ are respectively formed about 45 degrees with the X axis and Y axis, but the present invention is not limited thereto.

On the other hand, each of the first subpixels 122 is located adjacent to another one of the first subpixels 122 along the first axis $D_1$ or the second axis $D_2$, each of the second subpixels 124 is located adjacent to another one of the second subpixels 124 along the first axis $D_1$ or the second axis $D_2$, and each of the third subpixels 126/126a/126b/126c is located adjacent to another one of the third subpixels 126/126a/126b/126c along at least one of the first axis $D_1$ and the second axis $D_2$. That is, each of the display devices 100/200/300/400/500/600/700 composed of a plurality of subpixel groups connected to each other has at least two of the first subpixels 122 located adjacent to each, at least two of the second subpixels 124 located adjacent to each other, and at least two of the third subpixels 126/126a/126b/126c located adjacent to each other.

Thus, when two of the first subpixels 122 emitting the same color light or two of the second subpixels 124 emitting the same color light are located adjacent to each other, the pixel pitch of the two adjacent first subpixels 122 emitting the same color light or the two adjacent second subpixels 124 emitting the same color light can be reduced to each other, so that the space available on the substrate 110 can be increased to get a higher aperture ratio. Due to the increased aperture ratio of the substrate 110, the accommodation for setting circuit on the substrate can be also increased. On the other hand, since the space available on the substrate 110 is increased, so that the amount of the subpixel groups 120 provided on the substrate 110 can be also increased, thereby increasing overall emitting area of the display device 100/200/300/400/500/600/700. Accordingly, the resolution of the display device 100/200/300/400/500/600/700 can be effectively increased, and a better image quality would be obtained.

In some embodiments, each of the first subpixels 122 and each of the second subpixels 124 are respectively located adjacent to the corresponding first subpixel 122 and the corresponding second subpixel 124 along the same first axis $D_1$ or the same second axis $D_2$. Furthermore, each of the first subpixels 122 has only one side located adjacent to the corresponding first subpixel 122, and each of the second subpixels 124 has only one side located adjacent to the corresponding second subpixel 124, but the present invention is not limited thereto.

Referring to FIG. 1 of a schematic diagram for showing the arrangement of the subpixel groups 120 of the display device 100 according to the first embodiment of the present invention. As shown in FIG. 1, the first axis $D_1$ and the second axis $D_2$ are respectively formed about 45 degrees with the X axis and Y axis. In addition, each of the third subpixels 126 of the present embodiment is used for emitting a third color light, and the third color light may be green. That is, in the present embodiment, the first subpixel 122 may emit a blue light, the second subpixel 124 may emit a red light and the third subpixel 126 may emit a green light. Through adjusting light emitting order and the amount of the first subpixels 122, the second subpixels 124 and the third subpixels 126, different color effects would be obtained by color mixing method. It needs to be noted that the colors of the light emitted from the first subpixels 122, the second subpixels 124 and third subpixels 126 are not limited to above-mentioned description.

On the other hand, four of the third subpixels 126 of the present embodiment are located adjacent to the other third subpixels 126 along the first axis $D_1$ and the second axis $D_2$, and each of the third subpixels 126 has two adjacent sides respectively located adjacent to the corresponding first subpixel 122 and the corresponding second subpixel 124. Therefore, when the plurality of subpixel groups 120 are connected to each other, two of the first subpixels 122 emitting the same first color light are located adjacent to each other, two of the second subpixels 124 emitting the same second color light are located adjacent to each other, and four of the third subpixels 126 emitting the same third color light are located adjacent to each other. For example, in the single subpixel group 120, four (e.g., the first set) of the eight third subpixels 126 (for example green) are divided into two adjacent pairs of subpixels arranged adjacent to each other along the first axis $D_1$, and two of the different pairs of subpixels are located adjacent to each other along the second axis $D_2$. That is, a different pair of subpixels are located adjacent to each other along the second axis $D_2$, however, the other subpixel in the two pairs of subpixels are not adjacent to each other. In other words, two pairs of adjacent subpixels would be alternately arranged. The other four (e.g., the second set) of the eight third subpixels 126 (for example green) are also divided into two adjacent pairs of subpixels arranged adjacent to each other along the first axis $D_1$, and two of the different pairs of subpixels are also located adjacent to each other along the second axis $D_2$. That is, a different pair of subpixels are located adjacent to each other along the second axis $D_2$, however, the other subpixel in the two pairs of subpixels are not adjacent to each other. In other words, two pairs of adjacent subpixels would also be alternately arranged. Two (e.g., a third set) of the four first subpixels 122 (for example blue) are arranged adjacent to each other along the first axis $D_1$, two (e.g., a fourth set) of the four second subpixels 124 (for example red) are arranged adjacent to each other along the first axis $D_1$, and the third set of the four first subpixels 122 (for example blue) and the fourth set of the four second subpixels 124 (for example red) are arranged between the first set and the second set of the third subpixels 126. Therefore, one subpixel of the third set of the first subpixels 122 (for example blue) is connected adjacent to the first set of the third subpixels 126 (for example green) and the fourth set of the second subpixels 124 (for example red), and the other subpixel of the third set of the first subpixels 122 (for example blue) is connected adjacent to the second set of the third subpixels 126 (for example green). In other words, two pairs of adjacent subpixels would be alternately arranged. That is, the third set of the four first subpixels 122 (for example blue) and the fourth set of the four second subpixels 124 (for example red) are alternately arranged. One of the other two subpixels of the fourth set of the second subpixels 124 (for example red) and one of the other two subpixels of the third set of the first subpixels 122 (for example blue) are respectively connected adjacent to the first set of the third subpixels 126 (for example green), and the other one of the other two subpixels of the fourth set of the second subpixels 124 (for example red) and the other one of the other two subpixels of the third set of the first subpixels 122 (for example blue) are respectively connected adjacent to the second set of the third subpixels 126 (for example green).

Furthermore, in this embodiment, the locations of the two adjacent subpixels of the first subpixels 122 and the two adjacent subpixels of the second subpixels 124 between two sets of the third subpixels 126 can be interchanged. The present invention is not limited to FIG. 1.

In addition, in one of the subpixel groups 120, a subgroup can be defined by each of the first subpixels 122 combining one of the adjacent third subpixels 126, and a primary group can be defined by each of the second subpixels 124 combining one of the adjacent third subpixels 126. In the description of the following examples, the luminance value of the color is based on 8-bit gray level value, that is, using the gray level values of 1, 2, . . . , 254 to 255 values. It would be noted that the present invention may also be used to implement by the gray level values with other bits.

When the display device 100 emits the first color light, the first subpixel 122 of the subgroup emits a first color light, and the first subpixel 122 connected adjacent to the third subpixels 126 of the primary group also emits the first color light. When the gray level values of the first color light are displayed about 255, the luminance of the first color light is about 50% to 100% of the maximum luminance that the first subpixel 122 may display.

When the display device 100 emits the second color light, the second subpixel 124 of the primary group emits a second color light, and the second subpixel 124 connected adjacent to the third subpixels 126 of the subgroup also emits the second color light. When the gray level values of the second color light are displayed about 255, the luminance of the second color light is about 50% to 100% of the maximum luminance that the second subpixel 124 may display.

When the display device 100 emits the third color light, the third subpixels 126 in the subgroup and the primary group emit a third color light. When the gray level values of the third color light are displayed about 255, the luminance of the third color light is about 100% of the maximum luminance that the third subpixels 126 may display.

Furthermore, when the first color light, the second color light and the third color can be mixed to produce white light which is emitted from the display device 100, the first subpixel 122 and the third subpixels 126 of the subgroup respectively emit the first color light and the third color light, and the second subpixel 124 connected adjacent to the third subpixels 126 of the subgroup also emits the second color light. On the other hand, the second subpixel 124 and the third subpixels 126 of the primary group respectively emit the second color light and the third color light, and the first subpixel 122 connected adjacent to the third subpixels 126 of the primary group also emits the first color light. When the gray level values of the white light are displayed about 255, the luminance of the first color light is about 50% to 90% of the maximum luminance of the first color light, the luminance of the second color light is about 50% to 90% of the maximum luminance of the second color light, and the luminance of the third color light is about 100% of the maximum luminance of the third color light.

Figure 2:
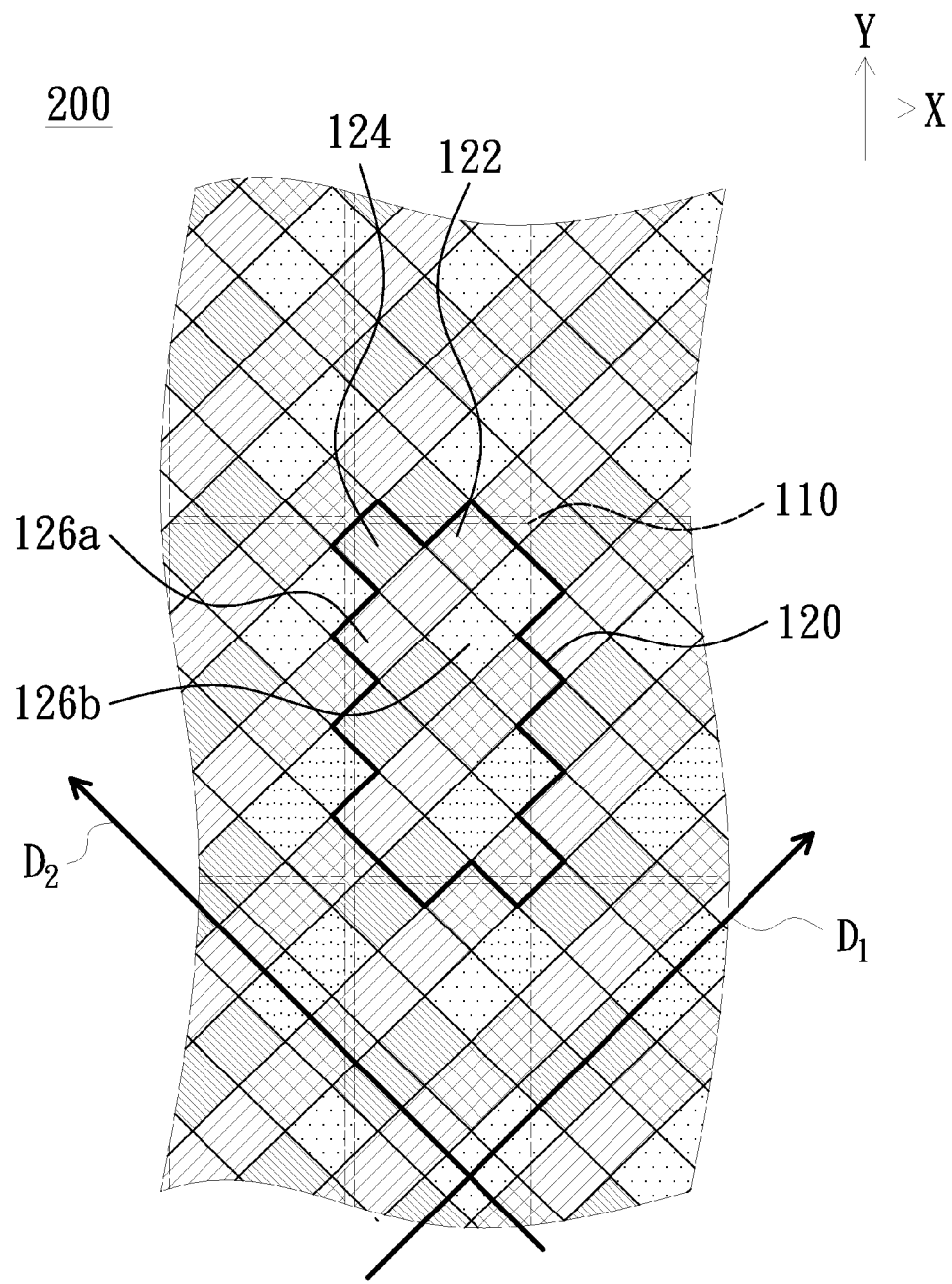
FIG. 2 is a schematic diagram for showing the arrangement of subpixel groups of the display device according to the second embodiment of the present invention.

Referring to FIG. 2 of a schematic diagram for showing the arrangement of the subpixel groups 120 of the display device 200 according to the second embodiment of the present invention. As shown in FIG. 2, the first axis $D_1$ and the second axis $D_2$ are respectively formed about 45 degrees with the X axis and Y axis. In addition, four of the third subpixels 126 of the present embodiment are used for emitting four third color lights, and the other four of the third subpixels 126 are used for emitting four fourth color lights. The third color light may be green, and the fourth color light may be yellow. That is, in the present embodiment, the first subpixel 122 may emit a blue light, the second subpixel 124 may emit a red light, part of the third subpixel 126 may emit a green light and the other part of the third subpixel 126 may emit a yellow light. Through adjusting light emitting order and the amount of the first subpixels 122, the second subpixels 124 and the third subpixels 126a/126b, different color effects would be obtained by color mixing method. It needs to be noted that the colors of the light emitted from the first subpixels 122, the second subpixels 124 and the third subpixels 126a/126b are not limited to above-mentioned description.

In the embodiment, each of the third subpixels 126a for emitting the third color light and each of the third subpixels 126b for emitting the four fourth color light are respectively located adjacent to the corresponding third subpixel 126a for emitting the third color lights and the corresponding third subpixel 126b for emitting the fourth color lights along the first axis $D_1$, but the present invention is not limited thereto. In other embodiment, each of the third subpixels 126a for emitting the third color light and each of the third subpixels 126b for emitting the four fourth color light are respectively located adjacent to the corresponding third subpixel 126a for emitting the third color lights and the corresponding third subpixel 126b for emitting the fourth color lights along the first axis $D_2$.

Additionally, when each of the third subpixels 126a for emitting the third color lights is located adjacent to the corresponding third subpixel 126b for emitting the fourth color light along the second axis $D_2$, each of the third subpixels 126a for emitting the third color lights is located adjacent to the corresponding third subpixel 126a for emitting the third color light along the first axis $D_1$, each of the third subpixels 126b for emitting the fourth color lights is located adjacent to the corresponding third subpixel 126b for emitting the fourth color along the first axis $D_1$, each of the first subpixels 122 is located adjacent to the corresponding first subpixel 122 along the first axis $D_1$, and each of the second subpixels 124 is located adjacent to the corresponding second subpixel 124 along the first axis $D_1$.

In other words, in other embodiments, when each of the third subpixels 126a for emitting the third color lights is located adjacent to the corresponding third subpixel 126b for emitting the fourth color light along the first axis $D_1$, each of the third subpixels 126a for emitting the third color lights is located adjacent to the corresponding third subpixel 126a for emitting the third color lights along the second axis $D_2$, each of the third subpixels 126b for emitting the fourth color lights is located adjacent to the corresponding third subpixel 126b for emitting the fourth color lights along the second axis $D_2$, each of the first subpixels 122 is located adjacent to the corresponding first subpixel 122 along the second axis $D_2$, and each of the second pixels 124 is located adjacent to the corresponding second subpixel 124 along the second axis $D_2$, but the present invention is not limited thereto. For example, in the single subpixel group 120, four (e.g., the first set) of the eight third subpixels 126 (for example the first subgroup 126a emits green light and the second subgroup 126b emits yellow light) are divided into two adjacent pairs of subpixels arranged adjacent to each other along the first axis $D_1$, and two of the different pairs of subpixels are located adjacent to each other along the second axis $D_2$. That is, a different pair of subpixels are located adjacent to each other along the second axis $D_2$, however, the other subpixel in the two pairs of subpixels are not adjacent to each other.

In other words, two pairs of adjacent subpixels (for example the first subgroup 126a emits green light and the second subgroup 126b emits yellow light) would be alternately arranged. The other four (e.g., the second set) of the eight third subpixels 126 (for example the first subgroup 126a emits green light and the second subgroup 126a emits yellow light) are also divided into two adjacent pairs of subpixels arranged adjacent to each other along the first axis $D_1$, and two of the different pairs of subpixels are also located adjacent to each other along the second axis $D_2$. That is, a different pair of subpixels are located adjacent to each other along the second axis $D_2$, however, the other subpixel in the two pairs of subpixels are not adjacent to each other. In other words, two pairs of adjacent subpixels (for example the first subgroup 126a emits green light and the second subgroup 126a emits yellow light) would also be alternately arranged. Two (e.g., a third set) of the four first subpixels 122 (for example blue) are arranged adjacent to each other along the first axis $D_1$, two (e.g., a fourth set) of the four second subpixels 124 (for example red) are arranged adjacent to each other along the first axis $D_1$, and the third set of the four first subpixels 122 (for example blue) and the fourth set of the four second subpixels 124 (for example red) are arranged between the first set and the second set of the third subpixels 126. Therefore, one of the two subpixels of the fourth set of the second subpixels 124 (for example red) is connected adjacent the first set of the third subpixels 126 (for example the first subgroup 126a emits green light and the second subgroup 126a emits yellow light) and the third set of the first subpixels 122 (for example blue), the third set of the first subpixels 122 (for example blue) is connected adjacent to the second set of the third subpixels 126 (for example the first subgroup 126a emits green light and the second subgroup 126a emits yellow light), the other one of the other two subpixels of the fourth set of the second subpixels 124 (for example red) is connected adjacent to the second set of the third subpixels 126 (for example the first subgroup 126a emits green light), and the other one of the other two subpixels of the third set of the first subpixels 122 (for example blue) is connected adjacent to the first set of the third subpixels 126 (for example the first subgroup 126b emits yellow light). In other words, two pairs of adjacent subpixels would be alternately arranged. That is, the third set of the four first subpixels 122 (for example blue) and the fourth set of the four second subpixels 124 (for example red) are alternately arranged. One of the other two subpixels of the fourth set of the second subpixels 124 (for example red) is connected adjacent to the first set of the third subpixels 126 (for example the first subgroup 126a emits green light), one of the other two subpixels of the third set of the first subpixels 122 (for example blue) is connected adjacent to the first set of the third subpixels 126 (for example the first subgroup 126a emits green light and the second subgroup 126a emits yellow light), the other one of the other two subpixels of the fourth set of the second subpixels 124 (for example red) is connected adjacent to the second set of the third subpixels 126 (for example the first subgroup 126a emits green light and the second subgroup 126a emits yellow light), and the other one of the other two subpixels of the third set of the first subpixels 122 (for example blue) is connected adjacent to the second set of the third subpixels 126 (for example the second subgroup 126a emits yellow light).

Furthermore, in the embodiment, two of the adjacent sides of each third subpixels 126a/126b are respectively connected adjacent to the corresponding first subpixels 122 and the corresponding second subpixels 124, but the present invention is not limited thereto.

Therefore, when a plurality of subgroups 120 are connected adjacent to each other, two of the first subpixels 122 for emitting the same first color lights are located adjacent to each other, two of the second subpixels 124 for emitting the same second color lights are located adjacent to each other, two of the third subpixels 126a for emitting the same third color lights are located adjacent to each other, and two of the third subpixels 126b for emitting the same fourth color lights are located adjacent to each other.

In addition, in one of the subpixel groups 120, a subgroup can be defined by each of the first subpixels 122 combining the adjacent third subpixels 126b for emitting the fourth color light, and a primary group can be defined by each of the second subpixels 124 combining the adjacent third subpixels 126a for emitting the third color light.

When the display device 200 emits the first color light, the first subpixel 122 of the subgroup emits a first color light, and the first subpixel 122 connected adjacent to the third subpixels 126a of the primary group also emits the first color light. When the gray level values of the first color light are displayed about 255, the luminance of the first color light is about 50% to 100% of the maximum luminance that the first subpixel 122 may display.

When the display device 200 emits the second color light, the second subpixel 124 of the primary group emits a second color light, and the second subpixel 124 connected adjacent to the third subpixels 126 of the subgroup also emits the second color light. When the gray level values of the second color light are displayed about 255, the luminance of the second color light is about 100% of the maximum luminance that the second subpixel 124 may display.

When the display device 200 emits the third color light, the third subpixels 126a in the primary group emit a third color light, and the third subpixels 126a connected adjacent to the third subpixels 126b in the subgroup also emit a third color light. When the gray level values of the third color light are displayed about 255, the luminance of the third color light is about 100% of the maximum luminance that the third subpixel 126a may display.

Furthermore, when the first color light, the second color light, the third color light, and the fourth color light can be mixed to produce white light which is emitted from the display device 200, the first subpixel 122 and the third subpixels 126b of the subgroup respectively emit the first color light and the fourth color light, the second subpixel 124 and the third subpixels 126a of the primary group respectively emit the second color light and the third color light, and the first subpixel 122 connected adjacent to the third subpixels 126a of the primary group also emits the first color light. In which the luminance of the first color light is about 50% to 90% of the maximum luminance of the first color light, the luminance of the second color light is about 100% of the maximum luminance of the second color light, the luminance of the third color light is about 100% of the maximum luminance of the third color light, and the luminance of the fourth color light is about 100% of the maximum luminance of the fourth color light.

Figure 3:
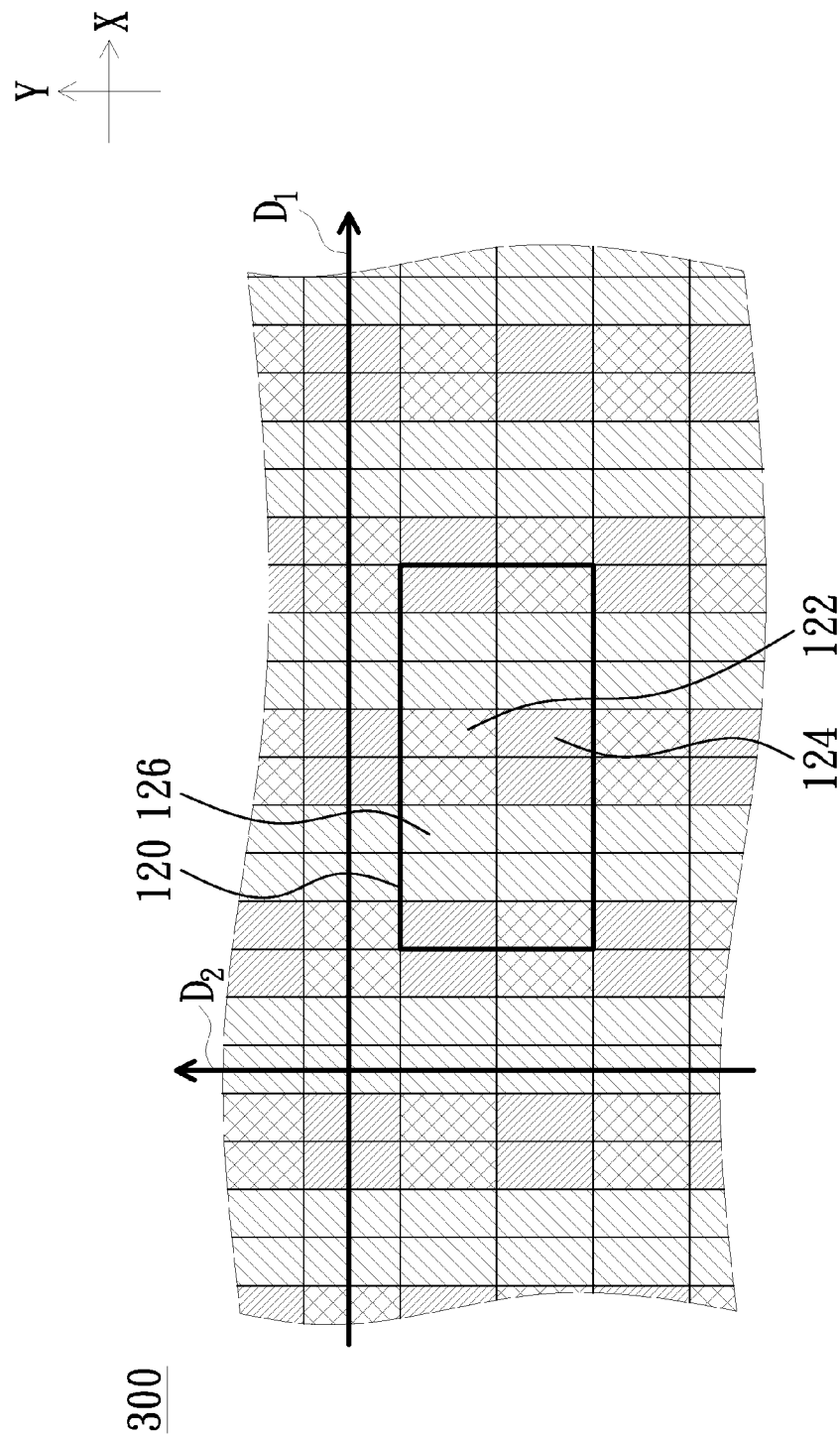
FIG. 3 is a schematic diagram for showing the arrangement of subpixel groups of the display device according to the third embodiment of the present invention.

Referring to FIG. 3 of a schematic diagram for showing the arrangement of the subpixel groups 120 of the display device 300 according to the third embodiment of the present invention. As shown in FIG. 3, the first axis $D_1$ and the second axis $D_2$ are respectively parallel to the X axis and Y axis. In addition, each of the third subpixels 126 of the present embodiment is used for emitting a third color light, and each of the third subpixels 126 is located adjacent to each other along the first axis $D_1$ and the second axis $D_2$. In the embodiment, the third color light may be green. That is, in the present embodiment, the first subpixel 122 may emit a blue light, the second subpixel 124 may emit a red light, and the third subpixel 126 may emit a green light. Through adjusting light emitting order and the amount of the first subpixels 122, the second subpixels 124 and the third subpixels 126, different color effects would be obtained by color mixing method. It needs to be noted that the colors of the light emitted from the first subpixels 122, the second subpixels 124 and the third subpixels 126 are not limited to above-mentioned description.

In the embodiment, each of the third subpixels 126 has only one side located adjacent to the corresponding first subpixel 122 or the corresponding second subpixel 124, but the present invention is not limited thereto.

Therefore, when a plurality of subpixel groups 120 are connected adjacent to each other, two of the first subpixels 122 for emitting the same first color lights are located adjacent to each other, two of the second subpixels 124 for emitting the same second color lights are located adjacent to each other, and at least four of the third subpixels 126 for emitting the same third color lights are located adjacent to each other. For example, a single subpixel group 120 shown in FIG. 3 includes at least 16 subpixels respectively arranged into a first row and a second row located adjacent to the first row. The arrangement of the first row from left to right is: one of the second subpixel 124, two of the third subpixels 126, two of the first subpixels 122, two of the third subpixels 126 and one of the second subpixel 124, namely RGGB-BGGR arrangement. While the arrangement of the second row from left to right is: one of the first subpixel 122, two of the third subpixels 126, two of the second subpixels 124, two of the third subpixels 126 and one of the first subpixel 122, namely BGGRRGGB arrangement for example.

In addition, in one of the subpixel groups 120, a subgroup can be defined by each of the first subpixels 122 combining the adjacent third subpixels 126, and a primary group can be defined by each of the second subpixels 124 combining the adjacent third subpixels 126.

When the display device 300 emits the first color light, the first subpixel 122 of the subgroup emits a first color light, and the first subpixel 122 connected adjacent to the third subpixels 126 of the primary group also emits the first color light. When the gray level values of the first color light are displayed about 255, the luminance of the first color light is about 50% to 100% of the maximum luminance that the first subpixel 122 may display.

When the display device 300 emits the second color light, the second subpixel 124 of the primary group emits a second color light, and the second subpixel 124 connected adjacent to the third subpixels 126 of the subgroup also emits the second color light. When the gray level values of the second color light are displayed about 255, the luminance of the second color light is about 50% to 100% of the maximum luminance that the second subpixel 124 may display.

When the display device 300 emits the third color light, the third subpixels 126 in the primary group and the subgroup emit the third color lights. When the gray level values of the third color light are displayed about 255, the luminance of the third color light is about 100% of the maximum luminance that the third subpixels 126 may display.

Furthermore, when the first color light, the second color light, and the third color light can be mixed to produce white light which is emitted from the display device 300, the first subpixel 122 and the third subpixels 126 of the subgroup respectively emit the first color light and the third color light, and the second subpixel 124 of the primary group connected adjacent to the third subpixels 126 of the subgroup also emits the second color light. On the other hand, the second subpixel 124 and the third subpixels 126 of the primary group respectively emit the second color light and the third color light, and the first subpixel 122 of the subgroup connected adjacent to the third subpixels 126 of the primary group also emits the first color light. When the gray level values of the white light are displayed about 255, the luminance of the first color light is about 50% to 90% of the maximum luminance of the first color light, the luminance of the second color light is about 50% to 90% of the maximum luminance of the second color light, and the luminance of the third color light is about 100% of the maximum luminance of the third color light.

Figure 4:
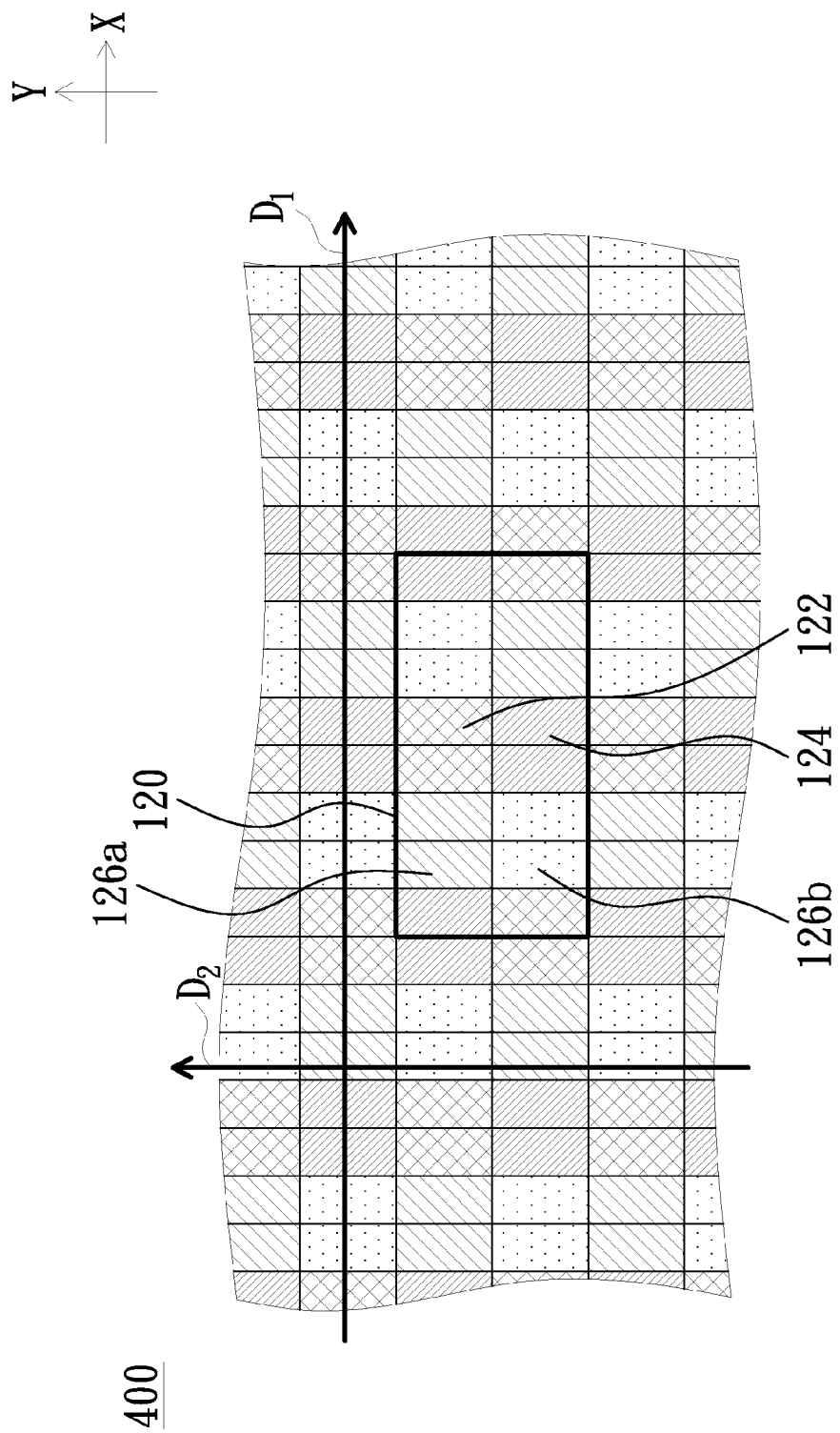
FIG. 4 is a schematic diagram for showing the arrangement of subpixel groups of the display device according to the fourth embodiment of the present invention.

Referring to FIG. 4 of a schematic diagram for showing the arrangement of the subpixel groups 120 of the display device 400 according to the third embodiment of the present invention. As shown in FIG. 4, the first axis $D_1$ and the second axis $D_2$ are respectively parallel to the X axis and Y axis.

In the embodiment, four of the third subpixels 126a in each of the subpixels groups 120 are used for emitting four third color lights, and the other four of the third subpixels 126b are used for emitting four fourth color lights. For example, the third color light may be green, and the fourth color light may be yellow. That is, in the present embodiment, the first subpixel 122 may emit a blue light, the second subpixel 124 may emit a red light, part of the third subpixel 126a may emit a green light and the other part of the third subpixel 126b may emit a yellow light. Through adjusting light emitting order and the amount of the first subpixels 122, the second subpixels 124 and the third subpixels 126a/126b, different color effects would be obtained by color mixing method. It needs to be noted that the colors of the light emitted from the first subpixels 122, the second subpixels 124 and the third subpixels 126a/126b are not limited to above-mentioned description.

In the embodiment, each of the third subpixels 126a for emitting the third color light, each of the third subpixels 126b for emitting the four fourth color light, each of the first subpixels 122 and each of the second subpixels 124 are respectively located adjacent to the corresponding third subpixel 126a for emitting the third color lights, the corresponding third subpixel 126b for emitting the fourth color lights, the corresponding first subpixel 122 and the corresponding second subpixel 124 along the first axis $D_1$. In other embodiment, each of the third subpixels 126a for emitting the third color light, each of the third subpixels 126b for emitting the four fourth color light, each of the first subpixels 122 and each of the second subpixels 124 are respectively located adjacent to the corresponding third subpixel 126a for emitting the third color lights, the corresponding third subpixel 126b for emitting the fourth color lights, the corresponding first subpixel 122 and the corresponding second subpixel 124 along the first axis $D_2$.

Additionally, when each of the third subpixels 126a for emitting the third color lights is located adjacent to the corresponding third subpixel 126b for emitting the fourth color light along the second axis $D_2$, each of the third subpixels 126a for emitting the third color lights is located adjacent to the corresponding third subpixel 126a for emitting the third color light along the first axis $D_1$, and each of the third subpixels 126b for emitting the fourth color lights is located adjacent to the corresponding third subpixel 126b for emitting the fourth color along the first axis $D_1$. In other words, in other embodiments, when each of the third subpixels 126a for emitting the third color lights is located adjacent to the corresponding third subpixel 126b for emitting the fourth color light along the first axis $D_1$, each of the third subpixels 126a for emitting the third color lights is located adjacent to the corresponding third subpixel 126a for emitting the third color lights along the second axis $D_2$, and each of the third subpixels 126b for emitting the fourth color lights is located adjacent to the corresponding third subpixel 126b for emitting the fourth color lights along the second axis $D_2$.

In the embodiment, each of the third subpixels 126a/126b has only one side located adjacent to the corresponding first subpixel 122 or the corresponding second subpixel 124, but the present invention is not limited thereto.

Therefore, when a plurality of subpixel groups 120 are connected adjacent to each other, two of the first subpixels 122 for emitting the same first color lights are located adjacent to each other, two of the second subpixels 124 for emitting the same second color lights are located adjacent to each other, two of the third subpixels 126a for emitting the same third color lights are located adjacent to each other, and two of the third subpixels 126b for emitting the same fourth color lights are located adjacent to each other. For example, a single subpixel group 120 shown in FIG. 4 includes at least 16 subpixels respectively arranged into a first row and a second row located adjacent to the first row. The arrangement of the first row from left to right is: one of the second subpixel 124, two of the third subpixels 126a (for example the first set of the first subgroup), two of the first subpixels 122, two of the third subpixels 126b (for example the first set of the second subgroup) and one of the second subpixel 124, namely RGGBBYYR arrangement. While the arrangement of the second row from left to right is: one of the first subpixel 122, two of the third subpixels 126b (for example the second set of the second subgroup), two of the second subpixels 124, two of the third subpixels 126a (for example the second set of the first subgroup) and one of the first subpixel 122, namely BYYRRGGB arrangement for example.

In addition, in one of the subpixel groups 120, a first subgroup can be defined by each of the first subpixels 122 combining the adjacent third subpixels 126b for emitting the fourth color light, a second subgroup can be defined by each of the first subpixels 122 combining the adjacent third subpixels 126a for emitting the third color light, a first primary group can be defined by each of the second subpixels 124 combining the adjacent third subpixels 126a for emitting the third color light, and a second primary group can be defined by each of the second subpixels 124 combining the adjacent third subpixels 126b for emitting the fourth color light.

When the display device 400 emits the first color light, the first subpixels 122 of the first subgroup and the second subgroup emit the first color lights, and the first subpixel 122 of the first subgroup and the second subgroup connected adjacent to the third subpixels 126a/b of the first primary group and the second primary group also emit the first color lights. When the gray level values of the first color light are displayed about 255, the luminance of the first color light is about 50% to 100% of the maximum luminance that the first subpixel 122 may display.

When the display device 400 emits the second color light, the second subpixel 124 of the first primary group and the second primary group emit the second color lights, and the second subpixel 124 of the first primary group and the second primary group connected adjacent to the third subpixels 126b/126a of the first subgroup and the second subgroup also emit the second color lights. When the gray level values of the second color light are displayed about 255, the luminance of the second color light is about 100% of the maximum luminance that the second subpixel 124 may display.

When the display device 400 emits the third color light, the third subpixels 126a of the first primary group, the third subpixels 126a connected adjacent to the third subpixels 126b of the second primary group, the third subpixels 126a connected adjacent to the third subpixels 126b of the first subgroup, and the third subpixels 126a connected adjacent to the third subpixels 126b of the second subgroup emit the third color lights. When the gray level values of the third color light are displayed about 255, the luminance of the third color light is about 100% of the maximum luminance that the third subpixels 126a may display.

Furthermore, when the first color light, the second color light, the third color light and the fourth color light can be mixed to produce white light which is emitted from the display device 400, the first subpixel 122 of the first subgroup and the third subpixel 126b respectively emits the first color light and the fourth color light, the first subpixel 122 of the second subgroup and the third subpixel 126a respectively emits the first color light and the third color light, and the second subpixel 124 of the first primary group connected adjacent to the third subpixel 126a of the second subgroup also emits the second color light. On the other hand, the second subpixel 124 of the first primary group and the third subpixel 126a respectively emits the second color light and the third color light, the first subpixel 122 of the first subgroup connected adjacent to the third subpixel 126a of the first primary group emits the first color light, the third subpixel 126b of the second primary group emits the fourth color light, and the first subpixel 122 of the second subgroup connected adjacent to the third subpixel 126b of the second primary group emits the first color light. When the gray level values of the white light are displayed about 255, the luminance of the first color light is about 50% to 90% of the maximum luminance of the first color light, the luminance of the second color light is about 100% of the maximum luminance of the second color light, the luminance of the third color light is about 100% of the maximum luminance of the third color light, and the luminance of the fourth color light is about 100% of the maximum luminance of the fourth color light.

Figure 5:
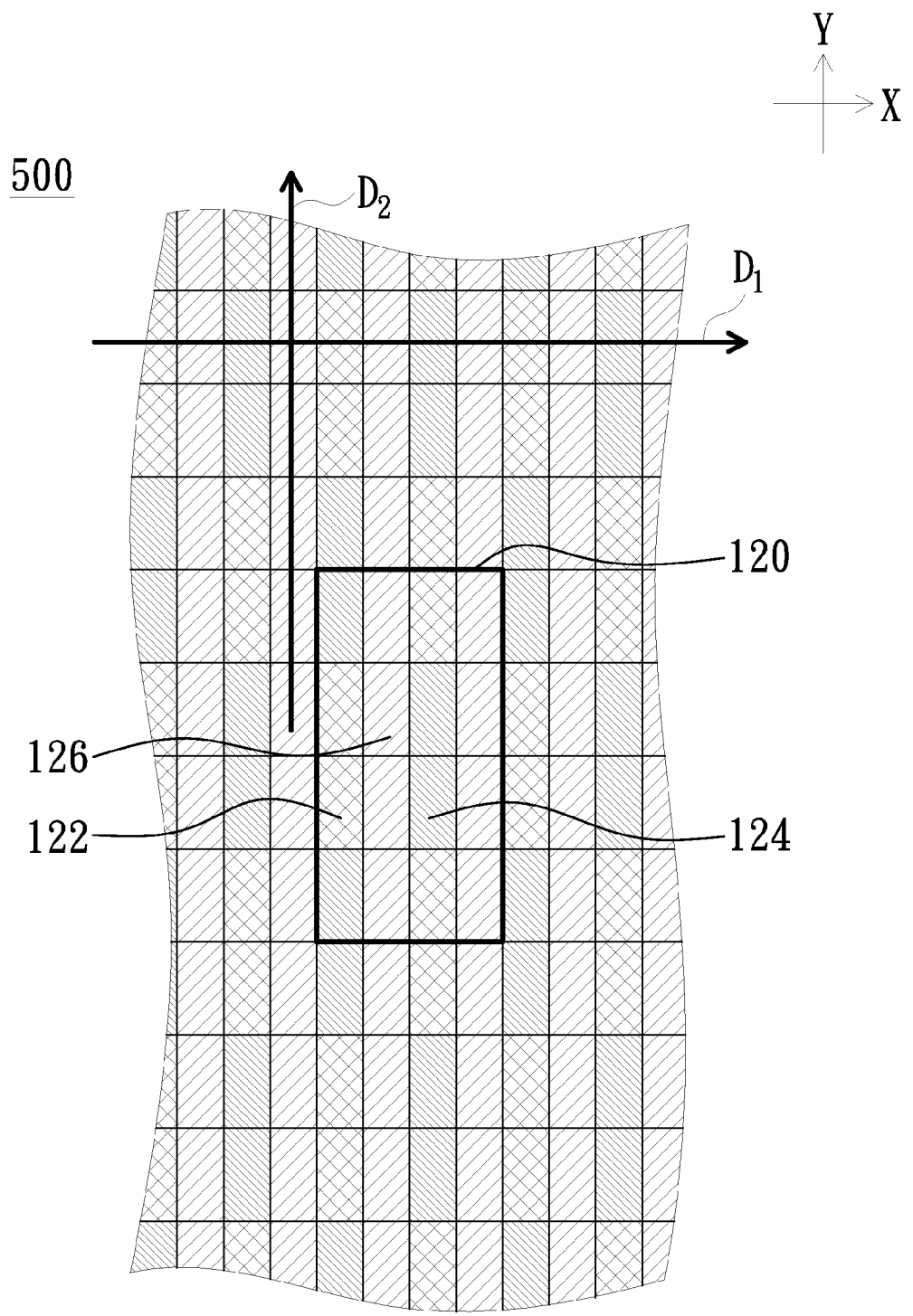
FIG. 5 is a schematic diagram for showing the arrangement of subpixel groups of the display device according to the fifth embodiment of the present invention.

Referring to FIG. 5 of a schematic diagram for showing the arrangement of the subpixel groups 120 of the display device 500 according to the fifth embodiment of the present invention. As shown in FIG. 5, the first axis $D_1$ and the second axis $D_2$ are respectively parallel to the X axis and Y axis. In addition, each of the third subpixels 126 of the present embodiment is used for emitting a third color light. In the embodiment, the third color light may be green. That is, in the present embodiment, the first subpixel 122 may emit a blue light, the second subpixel 124 may emit a red light, and the third subpixel 126 may emit a green light. Through adjusting light emitting order and the amount of the first subpixels 122, the second subpixels 124 and the third subpixels 126, different color effects would be obtained by color mixing method. It needs to be noted that the colors of the light emitted from the first subpixels 122, the second subpixels 124 and the third subpixels 126 are not limited to above-mentioned description.

In the embodiment, each of the first subpixels 122, each of the second subpixels 124 and each of the third subpixels 126 are respectively located adjacent to the corresponding first subpixel 122, the corresponding second subpixel 124 and the corresponding third subpixel 126 along the second axis $D_2$. In other embodiments, each of the first subpixels 122, each of the second subpixels 124 and each of the third subpixels 126 are respectively located adjacent to the corresponding first subpixel 122, the corresponding second subpixel 124 and the corresponding third subpixel 126 along the second axis $D_1$. Accordingly, in the embodiment, each of the third subpixels 126 has two opposite sides respectively located adjacent to the corresponding first subpixel 122 and the corresponding second subpixel 124 along the first axis $D_1$, but the present invention is not limited thereto.

Therefore, when a plurality of subpixel groups 120 are connected adjacent to each other, two of the first subpixels 122 for emitting the same first color lights are located adjacent to each other, two of the second subpixels 124 for emitting the same second color lights are located adjacent to each other, and at least four of the third subpixels 126 for emitting the same third color lights are located adjacent to each other. For example, a single subpixel group 120 shown in FIG. 5 includes at least 16 subpixels respectively arranged into a first row, a second row located adjacent to the first row, a third row adjacent to the second row, and a fourth row adjacent to the third row. The arrangement of the first row from left to right is: one of the second subpixel 124, one of the third subpixels 126, one of the first subpixels 122, and one of the third subpixels 126, namely RGBG arrangement. While the arrangement of the second row from left to right is: one of the first subpixel 122, one of the third subpixels 126, one of the second subpixels 124, and one of the third subpixels 126, namely BGRG arrangement. While the arrangement of the third row from left to right is: one of the first subpixel 122, one of the third subpixels 126, one of the second subpixels 124, and one of the third subpixels 126, namely BGRG arrangement. While the arrangement of the fourth row from left to right is: one of the second subpixel 124, one of the third subpixels 126, one of the first subpixels 122, and one of the third subpixels 126, namely RGBG arrangement for example.

In addition, in one of the subpixel groups 120, a subgroup can be defined by each of the first subpixels 122 combining the adjacent third subpixels 126, and a primary group can be defined by each of the second subpixels 124 combining the adjacent third subpixels 126.

When the display device 500 emits the first color light, the first subpixel 122 of the subgroup emits a first color light, and the first subpixel 122 connected adjacent to the third subpixels 126 of the primary group also emits the first color light. When the gray level values of the first color light are displayed about 255, the luminance of the first color light is about 50% to 100% of the maximum luminance that the first subpixel 122 may display.

When the display device 500 emits the second color light, the second subpixel 124 of the primary group emits a second color light, and the second subpixel 124 connected adjacent to the third subpixels 126 of the subgroup also emits the second color light. When the gray level values of the second color light are displayed about 255, the luminance of the second color light is about 50% to 100% of the maximum luminance that the second subpixel 124 may display.

When the display device 500 emits the third color light, the third subpixels 126 in the primary group and the subgroup emit the third color lights. When the gray level values of the third color light are displayed about 255, the luminance of the third color light is about 100% of the maximum luminance that the third subpixels 126 may display.

Furthermore, when the first color light, the second color light, and the third color light can be mixed to produce white light which is emitted from the display device 500, the first subpixel 122 of the subgroup and the third subpixels 126 respectively emit the first color light and the third color light, and the second subpixel 124 of the primary group connected adjacent to the third subpixels 126 of the subgroup also emits the second color light. On the other hand, the second subpixel 124 and the third subpixels 126 of the primary group respectively emit the second color light and the third color light, and the first subpixel 122 connected adjacent to the third subpixels 126 of the primary group also emits the first color light. When the gray level values of the white light are displayed about 255, the luminance of the first color light is about 50% to 90% of the maximum luminance of the first color light, the luminance of the second color light is about 50% to 90% of the maximum luminance of the second color light, and the luminance of the third color light is about 100% of the maximum luminance of the third color light.

Figure 6:
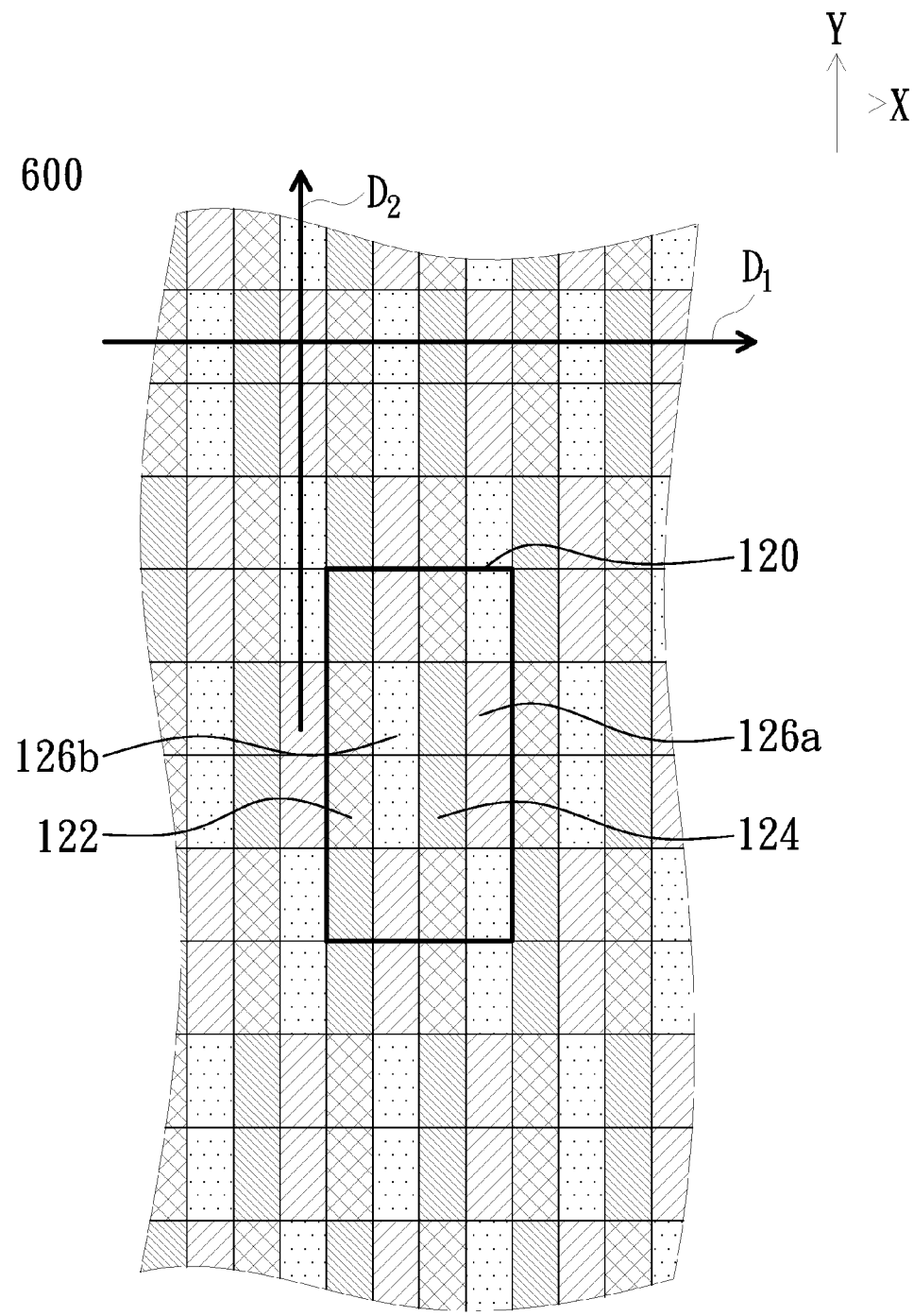
FIG. 6 is a schematic diagram for showing the arrangement of subpixel groups of the display device according to the sixth embodiment of the present invention.

Referring to FIG. 6 of a schematic diagram for showing the arrangement of the subpixel groups 120 of the display device 600 according to the sixth embodiment of the present invention. As shown in FIG. 6, the embodiment is substantially the same with the fifth embodiment of the present invention, and the difference between the two embodiments are that four of the third subpixels 126a are used for emitting four third color lights, and the other four of the third subpixels 126b are used for emitting four fourth color lights. In the embodiment, the third color light may be green, and the fourth color light may be yellow. That is, in the present embodiment, the first subpixel 122 may emit a blue light, the second subpixel 124 may emit a red light, part of the third subpixel 126a may emit a green light, and the other part of the third subpixel 126b may emit a yellow light. Through adjusting light emitting order and the amount of the first subpixels 122, the second subpixels 124 and the third subpixels 126a/126b, different color effects would be obtained by color mixing method. It needs to be noted that the colors of the light emitted from the first subpixels 122, the second subpixels 124 and the third subpixels 126a/126b are not limited to above-mentioned description.

In the embodiment, each of the third subpixels 126a for emitting the third color light and each of the third subpixels 126b for emitting the fourth color light are respectively located adjacent to the corresponding third subpixel 126a for emitting the third color light and the corresponding third subpixel 126b for emitting the fourth color light along the second axis $D_2$. In other embodiments, each of the third subpixels 126a for emitting the third color light and each of the third subpixels 126b for emitting the fourth color light are respectively located adjacent to the corresponding third subpixel 126a for emitting the third color light and the corresponding third subpixel 126b for emitting the fourth color light along the second axis $D_1$.

Accordingly, in the embodiment, each of the third subpixels 126a/126b has two opposite sides respectively located adjacent to the corresponding first subpixel 122 and the corresponding second subpixel 124 along the first axis $D_1$. Furthermore, when each of the third subpixels 126a for emitting the third color light has one side to be located adjacent to each of the third subpixels 126b for emitting the fourth color light along the second axis $D_2$, the opposite side of each third subpixels 126a for emitting the third color light is located adjacent to each of the third subpixels 126a for emitting the third color light along the second axis $D_2$, each of the first subpixels 122 is located adjacent to the corresponding first subpixel 122 along the second axis $D_2$, and each of the second subpixels 124 is located adjacent to the corresponding second subpixel 124 along the second axis $D_2$. That is, the third subpixels 126a for emitting the third color light has four sides for respectively connecting the corresponding first subpixel 122, the corresponding second subpixel 124, the third subpixels 126a for emitting the third color light, and the third subpixels 126b for emitting the fourth color light.

Therefore, when a plurality of subpixel groups 120 are connected adjacent to each other, two of the first subpixels 122 for emitting the same first color lights are located adjacent to each other, two of the second subpixels 124 for emitting the same second color lights are located adjacent to each other, two of the third subpixels 126a for emitting the same third color lights are located adjacent to each other, and two of the third subpixels 126b for emitting the same fourth color lights are located adjacent to each other. For example, a single subpixel group 120 shown in FIG. 6 includes at least 16 subpixels respectively arranged into a first row, a second row located adjacent to the first row, a third row adjacent to the second row, and a fourth row adjacent to the third row. The arrangement of the first row from left to right is: one of the second subpixel 124, one of the third subpixels 126a (such as the first subgroup), one of the first subpixels 122, and one of the third subpixels 126b (such as the second subgroup), namely RGBY arrangement. While the arrangement of the second row from left to right is: one of the first subpixel 122, one of the third subpixels 126b (such as the second subgroup), one of the second subpixels 124, and one of the third subpixels 126a (such as the first subgroup), namely BYRG arrangement. While the arrangement of the third row from left to right is: one of the first subpixel 122, one of the third subpixels 126b (such as the second subgroup), one of the second subpixels 124, and one of the third subpixels 126a (such as the first subgroup), namely BYRG arrangement. While the arrangement of the fourth row from left to right is: one of the second subpixel 124, one of the third subpixels 126a (such as the first subgroup), one of the first subpixels 122, and one of the third subpixels 126b (such as the second subgroup), namely RGBY arrangement for example.

In addition, in one of the subpixel groups 120, a subgroup can be defined by each of the first subpixels 122 combining the adjacent third subpixels 126b for emitting the fourth color light, and a primary group can be defined by each of the second subpixels 124 combining the adjacent third subpixels 126a for emitting the third color light.

When the display device 600 emits the first color light, the first subpixel 122 of the subgroup emits a first color light, and the first subpixel 122 connected adjacent to the third subpixels 126a of the primary group also emits the first color light. When the gray level values of the first color light are displayed about 255, the luminance of the first color light is about 50% to 100% of the maximum luminance that the first subpixel 122 may display.

When the display device 600 emits the second color light, the second subpixel 124 of the primary group emits a second color light, and the second subpixel 124 connected adjacent to the third subpixels 126b of the subgroup also emits the second color light. When the gray level values of the second color light are displayed about 255, the luminance of the second color light is about 100% of the maximum luminance that the second subpixel 124 may display.

When the display device 600 emits the third color light, the third subpixels 126a of the primary group and third subpixels 126a connected adjacent the third subpixels 126b of the subgroup emit the third color lights. When the gray level values of the third color light are displayed about 255, the luminance of the third color light is about 100% of the maximum luminance that the third subpixels 126a may display.

Furthermore, when the first color light, the second color light, the third color light, and the fourth color light can be mixed to produce white light which is emitted from the display device 600, the first subpixel 122 of the subgroup and the third subpixels 126b respectively emit the first color light and the fourth color light, the second subpixel 124 of the primary group and the third subpixels 126a respectively emit the second color light and the third color light, and the first subpixel 122 connected adjacent to the third subpixels 126a of the primary group also emits the first color light. When the gray level values of the white light are displayed about 255, the luminance of the first color light is about 50% to 90% of the maximum luminance of the first color light, the luminance of the second color light is about 100% of the maximum luminance of the second color light, the luminance of the third color light is about 100% of the maximum luminance of the third color light, and the luminance of the fourth color light is about 100% of the maximum luminance of the fourth color light.

Figure 7:
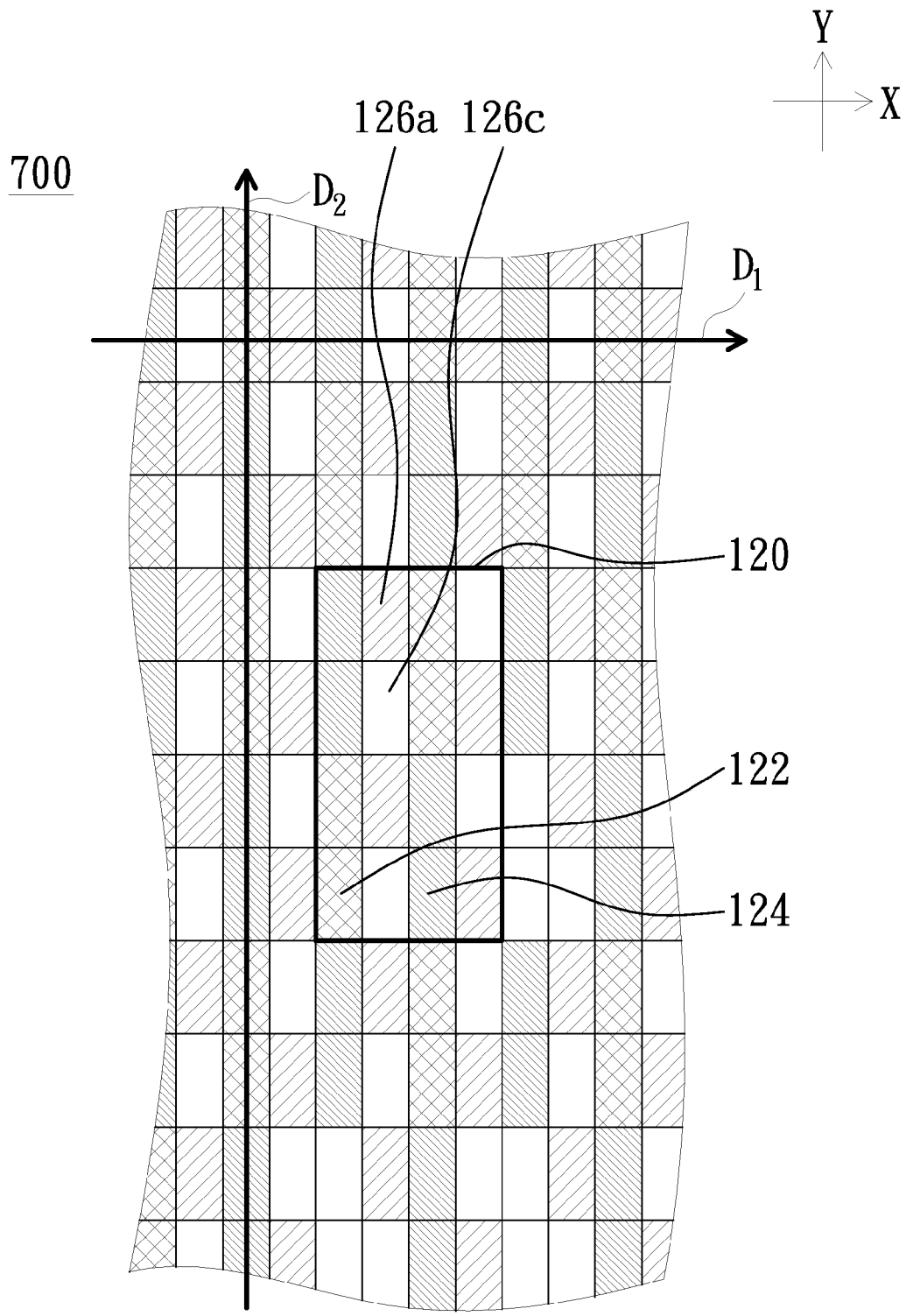
FIG. 7 is a schematic diagram for showing the arrangement of subpixel groups of the display device according to the seventh embodiment of the present invention.

Referring to FIG. 7 of a schematic diagram for showing the arrangement of the subpixel groups 120 of the display device 700 according to the seventh embodiment of the present invention. As shown in FIG. 7, the embodiment is substantially the same with the fifth embodiment of the present invention, and the difference between the two embodiments are that four of the third subpixels 126a are used for emitting four third color lights, and the other four of the third subpixels 126c are used for emitting four fourth color lights. In the embodiment, the third color light may be green, and the fourth color light may be white. That is, in the present embodiment, the first subpixel 122 may emit a blue light, the second subpixel 124 may emit a red light, part of the third subpixel 126a may emit a green light, and the other part of the third subpixel 126c may emit a white light. Through adjusting light emitting order and the amount of the first subpixels 122, the second subpixels 124 and the third subpixels 126a/126c, different color effects would be obtained by color mixing method. It needs to be noted that the colors of the light emitted from the first subpixels 122, the second subpixels 124 and the third subpixels 126a/126c are not limited to above-mentioned description.

Accordingly, in the embodiment, each of the third subpixels 126a for emitting the third color light and each of the third subpixels 126c for emitting the fourth color light are alternately arranged along the first axis $D_1$ or the second axis $D_2$.

Therefore, when a plurality of subpixel groups 120 are connected adjacent to each other, two of the first subpixels 122 for emitting the same first color lights are located adjacent to each other, two of the second subpixels 124 for emitting the same second color lights are located adjacent to each other.

In addition, in one of the subpixel groups 120, a first subgroup can be defined by each of the first subpixels 122 combining the adjacent third subpixels 126a for emitting the third color light, a second subgroup can be defined by each of the first subpixels 122 combining the adjacent third subpixels 126c for emitting the fourth color light, a first primary group can be defined by each of the second subpixels 124 combining the adjacent third subpixels 126a for emitting the third color light, and a second primary group can be defined by each of the second subpixels 124 combining the adjacent third subpixels 126c for emitting the fourth color light. For example, a single subpixel group 120 shown in FIG. 7 includes at least 16 subpixels respectively arranged into a first row, a second row located adjacent to the first row, a third row adjacent to the second row, and a fourth row adjacent to the third row. The arrangement of the first row from left to right is: one of the second subpixel 124, one of the third subpixels 126a (such as the first subgroup), one of the first subpixels 122, and one of the third subpixels 126c (such as the third subgroup), namely RGBW arrangement. While the arrangement of the second row from left to right is: one of the second subpixels 124, one of the third subpixels 126c (such as the third subgroup), one of the first subpixel 122, and one of the third subpixels 126a (such as the first subgroup), namely RWBG arrangement. While the arrangement of the third row from left to right is: one of the first subpixels 122, one of the third subpixels 126c (such as the third subgroup), one of the second subpixel 124, and one of the third subpixels 126a (such as the first subgroup), namely BGRW arrangement. While the arrangement of the fourth row from left to right is: one of the first subpixel 122, one of the third subpixels 126c (such as the third subgroup), one of the second subpixels 124, and one of the third subpixels 126a (such as the first subgroup), namely BWRG arrangement for example.

When the display device 700 emits the first color light, the first subpixels 122 of the first subgroup and the second subgroup emit the first color lights, and the first subpixels 122 of the first subgroup and the second subgroup connected adjacent to the corresponding third subpixels 126a/126c of the first primary group and the second primary group also emit the first color light. When the gray level values of the first color light are displayed about 255, the luminance of the first color light is about 100% of the maximum luminance that the first subpixel 122 may display.

When the display device 700 emits the second color light, the second subpixel 124 of the first primary group and the second primary group emit the second color lights, and the second subpixels 124 of the first primary group and the second primary group connected adjacent to the corresponding third subpixels 126a/126c of the first subgroup and the second subgroup also emit the second color lights. When the gray level values of the second color light are displayed about 255, the luminance of the second color light is about 100% of the maximum luminance that the second subpixel 124 may display.

When the display device 700 emits the third color light, the third subpixels 126a of the first primary group, the third subpixels 126a of the first subgroup connected adjacent to the third subpixels 126c of the second primary group, the third subpixels 126a of the first primary group connected adjacent to the third subpixels 126c of the second subgroup, and the third subpixels 126a of the first subgroup emit the third color lights. When the gray level values of the third color light are displayed about 255, the luminance of the third color light is about 100% of the maximum luminance that the third subpixels 126a may display.

Furthermore, when the first color light, the second color light, and the third color light can be mixed to produce white light which is emitted from the display device 700, the first subpixel 122 of the first subgroup and the third subpixels 126a respectively emit the first color light and the third color light, the second subpixel 124 of the first primary group connected adjacent to the third subpixels 126a of the first subgroup emits the second color light, and the third subpixels 126c of the first primary group and the second subgroup also emit the fourth color light (white light). Furthermore, the second subpixel 124 of the first primary group and the third subpixels 126a respectively emit the second color light and the third color light, and the first subpixel 122 of the first subgroup connected adjacent to the third subpixels 126a of the first primary group emits the first color light. In which, the luminance of the first color light is about the maximum luminance of the first color light, the luminance of the second color light is about the maximum luminance of the second color light, the luminance of the third color light is about the maximum luminance of the third color light, and the luminance of the fourth color light is about the maximum luminance of the fourth color light.

In comparison with the prior art, the present invention has the following advantages. Each of the first subpixels is located adjacent to another one of the first subpixels with the same color, each of the second subpixels is located adjacent to another one of the second subpixels with the same color, or the third subpixels is located adjacent to another one of the third subpixels with the same color. As the pixel pitch of the two adjacent first subpixels with the same color, the two adjacent second subpixels with the same color or the two adjacent third subpixels with the same color can be reduced to each other through a co-evaporation method, so that the space available on the substrate can be increased to get a higher aperture ratio. Due to the increased aperture ratio of the substrate, the accommodation for setting circuit on the substrate can be also increased. On the other hand, since the pixel pitch of the two adjacent first subpixels with the same color, the two adjacent second subpixels with the same color or the two adjacent third subpixels with the same color can be reduced to each other, so that the amount of the subpixel groups provided on the substrate can be increased, thereby increasing overall emitting area of the display device. Accordingly, the resolution of the display device can be effectively increased, and a better image quality would be obtained.

While the invention has been described in terms of what is presently considered to be the most practical and embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display device, comprising:
a substrate; and
a plurality of subpixel groups disposed on the substrate, each of the subpixel groups having four first subpixels for emitting four first color lights, four second subpixels for emitting four second color lights, and eight third subpixels;
wherein the first subpixels, the second subpixels, and the third subpixels are respectively arranged adjacent to each other along a first axis and a second axis intersecting the first axis;
wherein at least two of the first subpixels are arranged adjacent to each other along the first axis or the second axis, at least two of the second subpixels are arranged adjacent to each other along the first axis or the second axis, and at least two of the third subpixels are arranged adjacent to each other along at least one of the first axis and the second axis, and only one side of each of the first subpixels is located adjacent to one side of the neighboring first subpixel, and only one side of each of the second subpixels islocated adjacent to one side of the neighboring second subpixel.

2. The display device according to claim 1, wherein each of the first color lights is a blue light, and each of the second color lights is a red light.

3. The display device according to claim 1, wherein the first axis and the second axis are respectively parallel to the X axis and the Y axis.

4. The display device according to claim 1, wherein the first axis and the second axis are respectively formed about 45 degrees with the X axis and Y axis.

5. The display device according to claim 1, wherein each of the first subpixels and each of the second subpixels are respectively located adjacent to the corresponding first subpixel and the corresponding second subpixel along the same first axis or the same second axis.

6. The display device according to claim 1, wherein each of the first subpixels, each of the second subpixels and each of the third subpixels are respectively located adjacent to the corresponding first subpixel, the corresponding second subpixel and the corresponding third subpixel along the same first axis or the same second axis.

7. The display device according to claim 1, wherein each of the third subpixels is used for emitting a third color light, and four of the third subpixels are located adjacent to the other third subpixels along the first axis and the second axis.

8. The display device according to claim 7, wherein each of the third color lights is a green light.

9. The display device according to claim 1, wherein each of the third subpixels is used for emitting a third color light, and the third subpixels are located adjacent to each other along the first axis and the second axis.

10. The display device according to claim 9, wherein each of the third color lights is a green light.

11. The display device according to claim 1, wherein four of the third subpixels are used for emitting four third color lights, the other four of the third subpixels are used for emitting four fourth color lights, and each of the third subpixels for emitting the third color light and each of the third subpixels for emitting the four fourth color light are respectively located adjacent to the corresponding third subpixel for emitting the third color lights and the corresponding third subpixel for emitting the fourth color lights along the same first axis or the same second axis.

12. The display device according to claim 11, wherein each of the third color lights is a green light, and each of the fourth color lights is a yellow light.

13. The display device according to claim 11, wherein when each of the third subpixels for emitting the third color lights is located adjacent to the corresponding third subpixel for emitting the fourth color light along the second axis, each of the third subpixels for emitting the third color lights is located adjacent to the corresponding third subpixel for emitting the third color light along the first axis, each of the third subpixels for emitting the fourth color lights is located adjacent to the corresponding third subpixel for emitting the fourth color along the first axis, each of the first subpixels is located adjacent to the corresponding first subpixel along the first axis, and each of the second subpixels is located adjacent to the corresponding second subpixel along the first axis.

14. The display device according to claim 11, wherein when each of the third subpixels for emitting the third color lights is located adjacent to the corresponding third subpixel for emitting the fourth color light along the second axis, each of the third subpixels for emitting the third color lights is located adjacent to the corresponding third subpixel for emitting the third color lights along the second axis, each of the first subpixels is located adjacent to the corresponding first subpixel along the second axis, and each of the second pixels is located adjacent to the corresponding second subpixel along the second axis.

15. The display device according to claim 1, wherein four of the third subpixels are used for emitting four third color lights, the other four of the third subpixels are used for emitting four fourth color lights, and each of the third subpixels for emitting the third color light and each of the third subpixels for emitting the four fourth color light are alternately arranged along the same first axis or the same second axis.

16. The display device according to claim 15, wherein each of the third color lights is a green light, and each of the fourth color lights is a white light.

17. The display device according to claim 1, wherein each of the third subpixels has two adjacent sides respectively located adjacent to the corresponding first subpixel and the corresponding second subpixel.

18. The display device according to claim 1, wherein each of the third subpixels has two opposite sides respectively located adjacent to the corresponding first subpixel and the corresponding second subpixel.

19. The display device according to claim 1, wherein at least one of sides of the two neighboring first subpixels is connected to at least one of sides of the two neighboring second subpixels.

* * * * *